(12) United States Patent
Krishnamoorthy et al.

(10) Patent No.: US 8,148,202 B2
(45) Date of Patent: Apr. 3, 2012

(54) INTEGRATED CIRCUIT CHIP WITH SMART PIXELS THAT SUPPORTS THROUGH-CHIP ELECTROMAGNETIC COMMUNICATION

(75) Inventors: Ashok V. Krishnamoorthy, San Diego, CA (US); Arthur R. Zingher, San Diego, CA (US); Robert J. Drost, Mountain View, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 13/026,479

(22) Filed: Feb. 14, 2011

(65) Prior Publication Data

US 2011/0136297 A1    Jun. 9, 2011

Related U.S. Application Data

(62) Division of application No. 11/165,809, filed on Jun. 24, 2005, now Pat. No. 7,915,699.

(60) Provisional application No. 60/582,852, filed on Jun. 25, 2004.

(51) Int. Cl.
    *H01L 21/50* (2006.01)
(52) U.S. Cl. ......... 438/109; 438/107; 257/774; 257/777
(58) Field of Classification Search ................... 257/777, 257/774, 621; 438/107
    See application file for complete search history.

(56) References Cited

U.S. PATENT DOCUMENTS

| | | | |
|---|---|---|---|
| 5,034,789 A | 7/1991 | Black | |
| 5,629,838 A | 5/1997 | Knight | |
| 5,848,214 A | 12/1998 | Haas | |
| 6,090,636 A * | 7/2000 | Geusic et al. | 438/31 |
| 6,422,473 B1 | 7/2002 | Ikefuji | |
| 6,728,113 B1 | 4/2004 | Knight | |
| 6,916,719 B1 | 7/2005 | Knight | |
| 7,385,655 B2 | 6/2008 | Imai | |
| 2003/0007745 A1 | 1/2003 | Martwick | |
| 2003/0071334 A1 * | 4/2003 | Murphy et al. | 257/678 |
| 2003/0197186 A1 | 10/2003 | Geusic | |
| 2004/0036074 A1 | 2/2004 | Kondo | |
| 2005/0069181 A1 * | 3/2005 | Setlak et al. | 382/124 |

OTHER PUBLICATIONS

Krishnamoorthy et al., "Ring Oscillators with Optical and Electrical Readout Based on Hybrid GaAs MQW Modulators Bonded to 0,8um silicon VLSI circuits," Electronics Letters, Oct. 26, 1995, vol. 31, No. 22, pp. 1917-1918.

* cited by examiner

*Primary Examiner* — Wai Sing Louie
*Assistant Examiner* — Bilkis Jahan
(74) *Attorney, Agent, or Firm* — Park, Vaughn, Fleming & Dowler LLP; Anthony Jones

(57) ABSTRACT

One embodiment of the present invention provides an integrated circuit chip, including an active face upon which active circuitry and signal pads reside, and a back face opposite the active face. The integrated circuit chip additionally comprises an electromagnetic via that facilitates communication between signal pads on the integrated circuit chip and signal pads on a second integrated circuit chip. The electromagnetic via couples a signal pad on the active face of the integrated circuit chip to the back face of the integrated circuit chip so that the integrated circuit chip can communicate with the second integrated circuit chip while the back face of the integrated circuit chip is adjacent to the active face of the second integrated circuit chip. Moreover, the electromagnetic via operates by facilitating non-conductive signaling through the integrated circuit chip.

9 Claims, 5 Drawing Sheets

ACTIVE SIDE
(TOP VIEW)

INTEGRATED CIRCUIT CHIP WITH SMART PIXELS THAT SUPPORTS THROUGH-CHIP ELECTROMAGNETIC COMMUNICATION

RELATED APPLICATION

This application is a divisional application of, and hereby claims priority under 35 U.S.C. §120 to, pending U.S. patent application Ser. No. 11/165,809, filed 24 Jun. 2005, entitled "Integrated Circuit Chip That Supports Through-Chip Electromagnetic Communication". This application further claims priority under 35 U.S.C. §120 to U.S. provisional patent application No. 60/582,852, filed on 25 Jun. 2004, entitled "Electromagnetic Communication through an Integrated Chip," by inventors Ashok V. Krishnamoorthy, Arthur R. Zingher, and Robert J. Drost, to which this application's parent application Ser. No. 11/165,809 also claims priority.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

The present invention relates to the design of an integrated circuit chip that supports through-chip communication.

Conductive electrical interconnections and transceivers have long being used to provide reliable interconnections to and from semiconductor devices, and have dominated the interconnect hierarchy because of significant advantages in packaging and manufacturing. As decreasing linewidths allow millions of circuit elements to be incorporated into a semiconductor chip, and as these circuit elements are able to operate at faster on-chip clock rates, traditional resistive wires are no longer able to provide the off-chip bandwidths necessary to fully utilize the computational resources available on-chip.

For performance and scalability reasons, "conventional" current-modulation or current-injection Vertical Cavity Surface Emitting Lasers (VCSELs) are bandwidth limited for the following reasons: (1) they have topological limits which are typically related to perimeter wiring (wire-bonds) or low-density 2-dimensional area array flip-chip bonding; (2) they have RC limits which are caused by charging and discharging of contact and parasitic capacitance; and (3) there is lower power dissipation for off-chip drivers which must drive low-impedance lines.

To overcome these inherent limitations, a new form of inter-chip or inter-wafer signaling, called "proximity communication," has recently been proposed (see I. Sutherland, "Face-to-Face Chips," U.S. Pat. No. 6,500,696, issued Dec. 31, 2002). This communication technique relies on capacitive coupling between chips which are oriented face-to-face. Capacitive coupling allows signal densities two orders of magnitude greater than traditional off-chip communication using wire-bonding or traditional ball-bonding. Additionally, the associated circuits and coupling structures are fully compatible with the standard CMOS foundries with no modifications needed to their processes. Furthermore, in order to communicate off-chip, the circuits typically drive a high-impedance, capacitive pad, very much akin to the gate of a transistor. This eliminates the need for high-to-low impedance conversion, which has traditionally prevented substantive reduction in the power dissipation of the off-chip driver circuits in spite of improvements in transistor efficiency.

Ultimately, proximity communication provides an off-chip signaling bandwidth that can scale with the feature size and on-chip frequency. However, a number of topological constraints have been required to make this form of communication to be effective. As illustrated in FIG. 1 and FIG. 2, the chips needed to face each other, with their active sides abutting with full or partial overlap. As shown in FIG. 2, this allows for a two-layer stack of chips to be formed and scaled in planar configurations.

Furthermore, optical interconnections and transceivers are now also being used to provide reliable interconnections between electronic components. These can scale in both distance and speed. As one example, optical links based on VCSELs have had a substantial impact into this industry as a low-cost, wafer-scale, and high-speed device that can directly be driven by low-cost silicon circuits for transceivers in the 1-10 Gbit/s range.

Recently, it has also been shown that such VCSELs and other optoelectronic components, including detectors and optical modulators, can be directly integrated with Silicon CMOS (see A. Krishnamoorthy, and K. W. Goossen, "Optoelectronic-VLSI: Photonics integrated with VLSI circuits," IEEE J. Special Topics in Quantum Electronics, Vol. 4, No. 6, pp. 899-912, January 1999). It has also been shown that both top-emitting as well as bottom-emitting VCSELs configurations can be used for this integration.

A straightforward combination of capacitive coupling and optical signaling is illustrated in FIG. 3. Chips are placed face-to-face allowing planar tiling with both optical and capacitive coupling of signals to the active surface of the chips, namely the side that is processed with transistor circuits, various metallizations and optical devices respectively.

For topological reasons, there is a potential advantage in a more generalized structure wherein chips may be stacked in three dimensions. Additionally, for packaging and heat-removal reasons, it may be advantageous even for a two-chip stack for the active surfaces of both chips to face the same direction. By contrast, conductive communication through a chip suffers from a need to fabricate a conductive "via" through the chip. Thus, there is a need for a form of two-sided wireless chip or wafer communication without the limitations of the aforementioned art.

SUMMARY

One embodiment of the present invention provides an integrated circuit chip, including an active face upon which active circuitry and signal pads reside, and a back face opposite the active face. The integrated circuit chip additionally comprises an electromagnetic via that facilitates communication between signal pads on the integrated circuit chip and signal pads on a second integrated circuit chip. The electromagnetic via couples a signal pad on the active face of the integrated circuit chip to the back face of the integrated circuit chip so that the integrated circuit chip can communicate with the second integrated circuit chip while the back face of the integrated circuit chip is adjacent to the active face of the second integrated circuit chip. Moreover, the electromagnetic via operates by facilitating non-conductive signaling through the integrated circuit chip.

In a variation on this embodiment, the electromagnetic via facilitates capacitive signaling through the integrated circuit chip.

In a variation on this embodiment, the electromagnetic via facilitates inductive signaling through the integrated circuit chip.

In a variation on this embodiment, the electromagnetic via facilitates optical signaling through the integrated circuit chip.

In a variation on this embodiment, the integrated circuit chip additionally comprises an array of electromagnetic vias structured to facilitate spatial balancing of electromagnetic signals, temporal balancing of electromagnetic signals, or electronic alignment of the integrated circuit chip to a second integrated circuit chip.

In a variation on this embodiment, the integrated circuit chip additionally comprises a second electromagnetic via. The second electromagnetic via can couple the integrated circuit chip to the second integrated circuit chip or to a third integrated circuit chip. In addition, the second electromagnetic via can facilitate a different type of signaling than the electromagnetic via.

In a variation on this embodiment, a substrate of the integrated circuit chip is comprised of Silicon-on-Insulator (SOI), Silicon on Sapphire (SOS), or Silicon on Diamond (SOD). SOS is particularly favorable because sapphire is optical transparent, which facilitates an optical electromagnetic via. SOD is particularly favorable because diamond has extraordinary thermal conductivity, which facilitates thermal spreading and cooling even in a very thin IC chip.

In a variation on this embodiment, a substrate of the integrated circuit chip is doped so that an area of the substrate is semi-insulating.

In a variation on this embodiment, a substrate of the integrated circuit chip is comprised of a crystalline material so that the substrate is transparent to various wavelengths of light.

In a further variation, the crystalline material is sapphire.

In a variation on this embodiment, the integrated circuit chip is stacked with other integrated circuit chips to form a module comprised of multiple layers of integrated circuit chips, wherein the multiple layers of integrated circuit chips in the module are interconnected with electromagnetic vias.

In a further variation, the electromagnetic via and the second electromagnetic via are configured on the integrated circuit chip to produce a smart pixel. This smart pixel has a dedicated function, which can include a logic function, a memory function, an input/output function, or a control function.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Background

The present invention facilitates the creation of electromagnetic vias which allows for new methods of intra-chip and inter-chip communication. Note that it is possible to use electromagnetic vias to communicate from IC chip to IC chip across a gap, or even through the substrate of one or more IC chips. Also note that the electromagnetic vias can be used to communicate through IC chips that are made of various materials, including, but not limited to, Semiconductor on Insulator, Semiconductor on Semi-Insulator, Semiconductor on Insulator with high thermal conductivity, and Semiconductor on Diamond.

Through-Chip Proximity Communication

Figure 1:
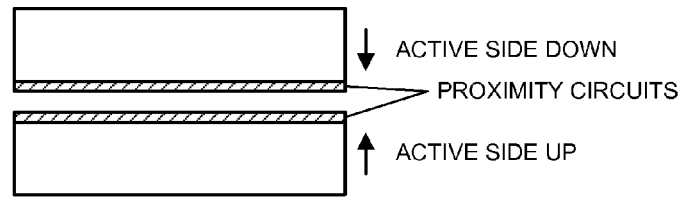
FIG. 1 illustrates proximity communication using face-to-face chips.
Figure 2:
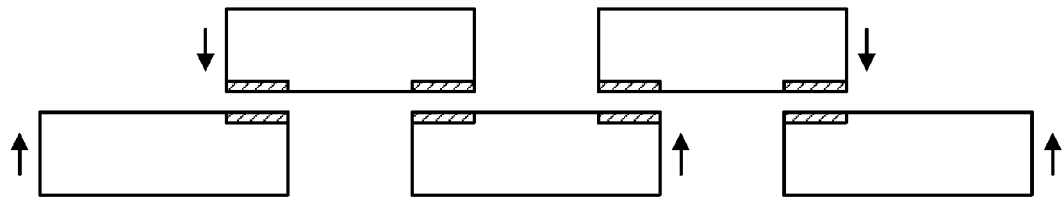
FIG. 2 illustrates proximity communication in a tiled array of face-to-face chips.
Figure 3:
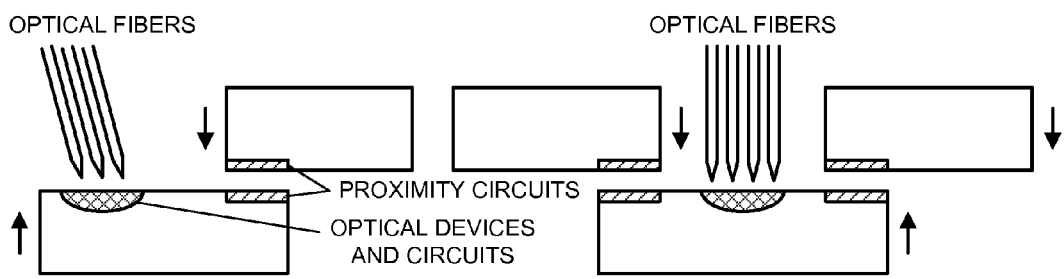
FIG. 3 illustrates proximity and optical communication in an array of face-to-face chips.
Figure 4A:
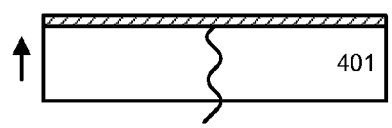
FIG. 4A illustrates through-chip proximity communication in accordance with an embodiment of the present invention.

FIG. 4 illustrates through-chip proximity communication in accordance with an embodiment of the present invention. In this embodiment, signals travel through chip 401 to the active surface of chip 401. These signals can include any type of electromagnetic signal, including capacitive signals, inductive signals, optical signals, or resistive signals.

Figure 4B:
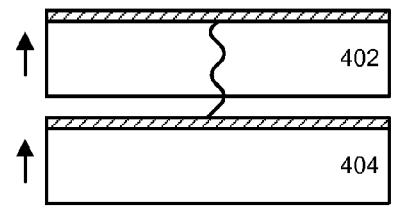
FIG. 4B illustrates through-chip proximity communication with two chips in accordance with an embodiment of the present invention.

FIG. 4B illustrates through-chip proximity communication with two chips in accordance with an embodiment of the present invention. In this example, chips 402 and 404 are arranged such that the active face of chip 404 is adjacent to the non-active face of chip 402. Chip 402 communicates with chip 404 via a capacitive coupling through chip 402.

Although this is typically not possible with standard Silicon CMOS because of the conductive nature of the substrate, this form of proximity communication can be advantageously achieved on insulated-substrate technologies such as Silicon-on-Insulator (SOI) CMOS. Also, this can be achieved by suitable doping of a semiconductor wafer so that it is semi-insulating in the local regions of interest. Such doping is well known and practiced in the industry. Additionally, thinning the insulating substrate may enhance this form of through-chip proximity communication.

Silicon On Insulator (SOI) may include various insulators, some with particularly favorable properties. Some insulators are silicon compounds, such as $SiO_2$, $SiO_x$, $SiN_x$, where x represents an indefinite number of atoms. Another insulator is Sapphire ($Al_2O_3$). This can be optically very transparent, even in a relatively thick IC, which is especially favorable for an embodiment using optical electro-magnetic coupling. Silicon on Oxide or Silicon on Sapphire are each widely used forms of Silicon On Insulator.

Silicon on Diamond (SOD) is particularly favorable for an embodiment with a very thin IC chip. Diamond has extraordinarily high thermal conductivity. Thus, even a thin layer of diamond can provide useful lateral thermal spreading, and thus facilitate cooling heat dissipated in the IC chip.

Through-Chip Optical and Proximity Communication

Figure 5A:
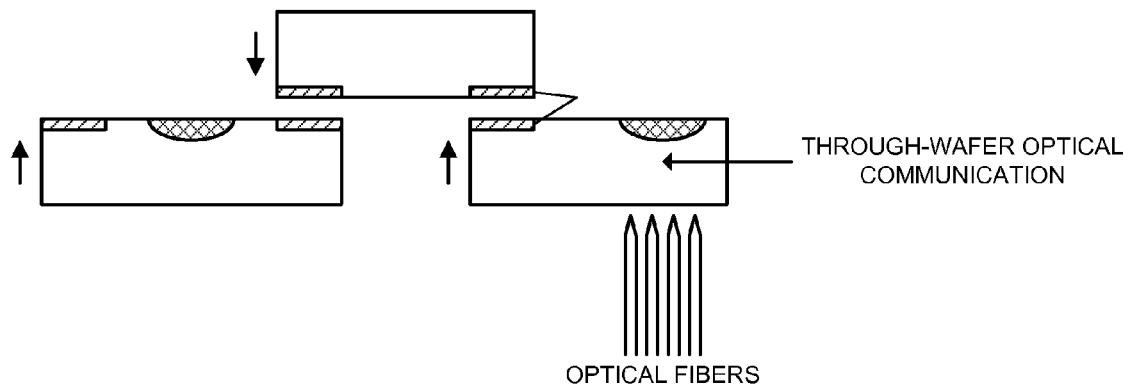
FIG. 5A illustrates through-chip optical and proximity communication using face-to-face chips in accordance with an embodiment of the present invention.
Figure 5B:
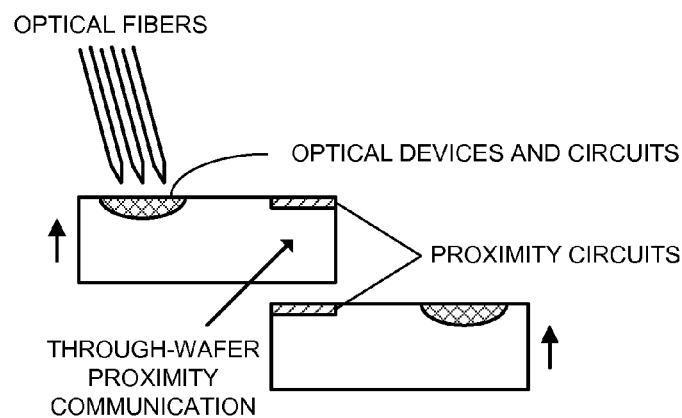
FIG. 5B illustrates optical and through-chip proximity communication using stacked chips in accordance with an embodiment of the present invention.

Recognizing that certain forms of semiconductor or other crystalline substrates can be transparent at specific wavelengths, one inventive means of achieving two-sided communication to the chip or wafer is shown in FIG. 5A and FIG. 5B. For instance, it is known that Silicon is transparent at certain communication wavelengths of interest (e.g. 1.5 microns). Additionally, certain crystalline substrates are known to be suitable for circuit fabrication (e.g. Sapphire) and are transparent to visible and infra-red radiation.

FIG. 5A illustrates through-chip optical and proximity communication using face-to-face chips in accordance with an embodiment of the present invention. Assuming the appropriate combination of top-emitting and bottom-emitting optical devices are attached to the surface of the chips, one can then anticipate an advantageous three-dimensional geometry of such arrays of chips.

Figure 6:
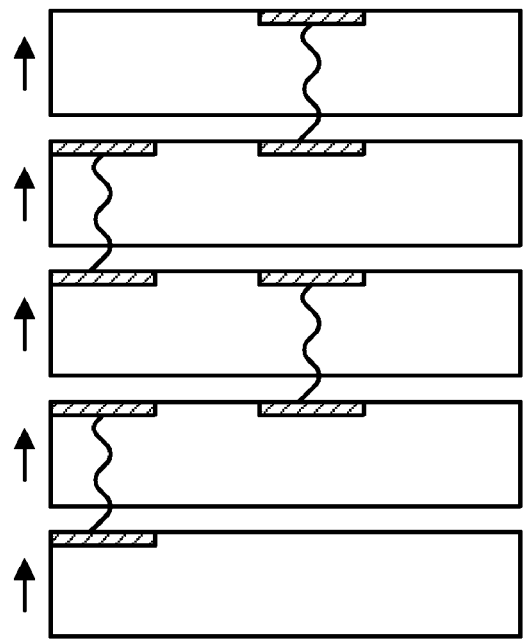
FIG. 6 illustrates a 3-D stack of chips using through-chip proximity communication in accordance with an embodiment of the present invention.

FIG. 5B illustrates optical and through-chip proximity communication using stacked chips in accordance with an embodiment of the present invention. 3-dimensional chip stacks can thus be achieved with a convenient combination of through-chip proximity communication and optionally optical communication at wavelengths where the corresponding insulated substrates are transparent. For example, FIG. 6 illustrates a 3-D stack of chips using through-chip proximity communication in accordance with an embodiment of the present invention.

Note that various combinations of optical through-chip and Proximity through-chip communication can be practiced according to the optical transparency and the electrical insulation of the chip substrate. Moreover, the thinning of the substrate benefits both proximity coupling as well as optical transmission by reducing optical attenuation due to scattering losses.

Optical and Proximity Communication to a Back-Side Laminated Chip Sandwich

Figure 7:
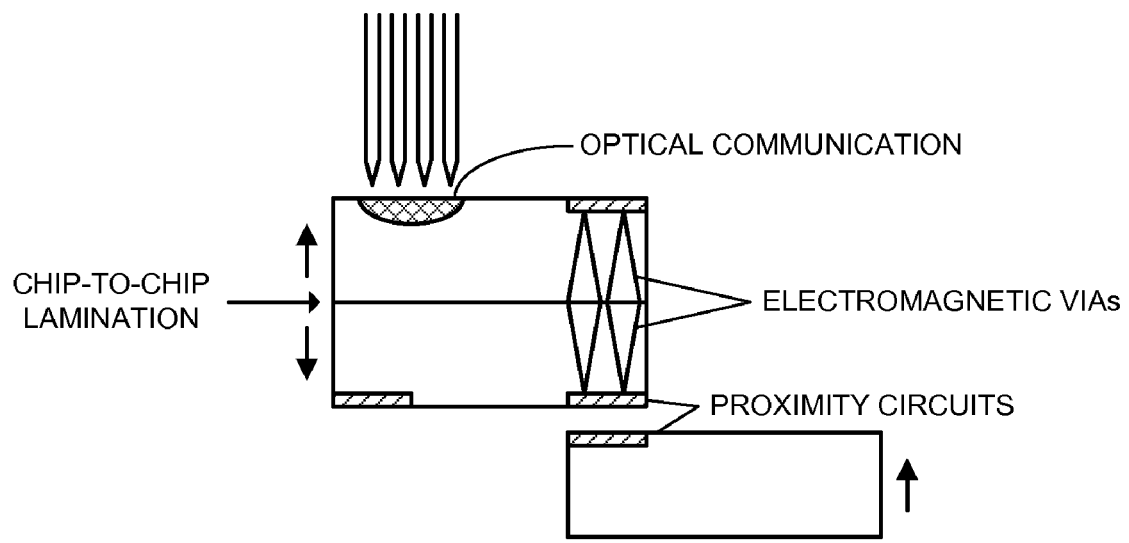
FIG. 7 illustrates optical and proximity communication to a back-side laminated chip sandwich with resistive through-chip interconnects in accordance with an embodiment of the present invention.

FIG. 7 illustrates optical and proximity communication to a back-side laminated chip sandwich with resistive through-chip interconnects in accordance with an embodiment of the present invention. Capacitive proximity coupling enables wireless stimulation of a current signal at a receiver through voltage modulation at the source. Likewise, inductive proximity coupling can correspondingly stimulate a voltage signal through current modulation at the source. Without loss of generality, these paradigms can be used interchangeably and in concert in the various topologies described herein.

It is also possible to combine conductive through-chip interconnects (e.g. conductive vias) and chip-lamination technologies to make chip "sandwiches" that may be stacked in three-dimensions. A generalization of the principles embodied in the present invention would advantageously use such chip sandwiches to make 3-D chips stacks with 2-sided communication using combinations of optical communication, conductive communication, capacitive proximity communication and/or inductive proximity communication methods.

As previously mentioned, one of the advantages afforded by the present invention is the ability to create 3-dimensional stacks of chips with wireless communication between chips. In the prior art, 3-dimensional stacks could also be created using traditional conductive interconnects and solder. These attachments were typically permanent or semi-permanent. Thus, individual chips could not be conveniently replaced or repaired once assembled. An advantage of the techniques described here is the inherent ability of the two-sided wireless communication to be unassembled and reassembled. The reassembled structure may be the same or different from the original structure.

Smart Pixels

Figure 8:
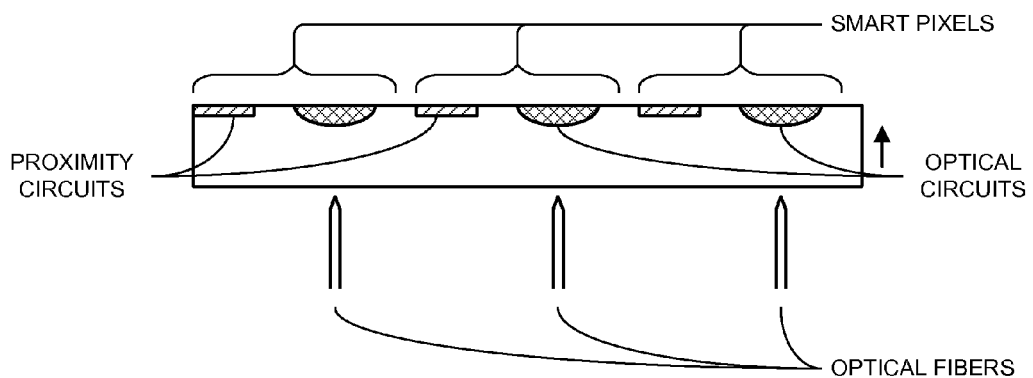
FIG. 8 illustrates smart pixels with interleaved surface and through-chip communication ports in accordance with an embodiment of the present invention.
Figure 9:
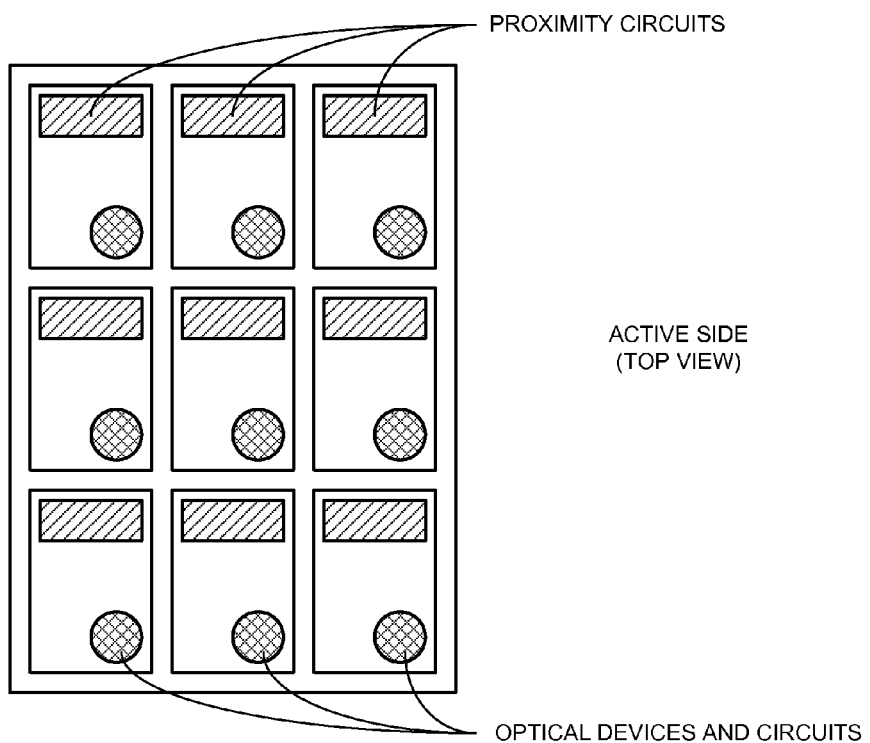
FIG. 9 illustrates a top-surface view of a smart pixel array in accordance with an embodiment of the present invention.

FIG. 8 illustrates smart pixels with interleaved surface and through-chip communication ports in accordance with an embodiment of the present invention. FIG. 9 illustrates a top-surface view of a smart pixel array in accordance with an embodiment of the present invention. Two-sided communication from a chip, even for a single plane of chips, has another advantage. It allows the communication and logic on a Silicon VLSI chip to be partitioned and placed optimally for a given task.

In one exemplary arrangement shown in FIG. 8 and FIG. 9, an array of processor units or "smart pixels" is presented. Each pixel has dedicated functions such as input/output, logic, memory and control that may operate independently of other processors units. Such pixel-based processors have been shown to be advantageous for certain applications (see H. S. Hinton, Editor: Special Issue on Smart Pixels, International Journal of Optoelectronics, Vol. 11, No. 3, May-June 1997). Such units may further be stacked into three-dimensional topologies as described in this disclosure with attendant topological advantages. Note that such arrangements of smart-pixel chips may be particularly useful for image processing and related applications.

Three-Terminal Optoelectronic Device

Figure 10:
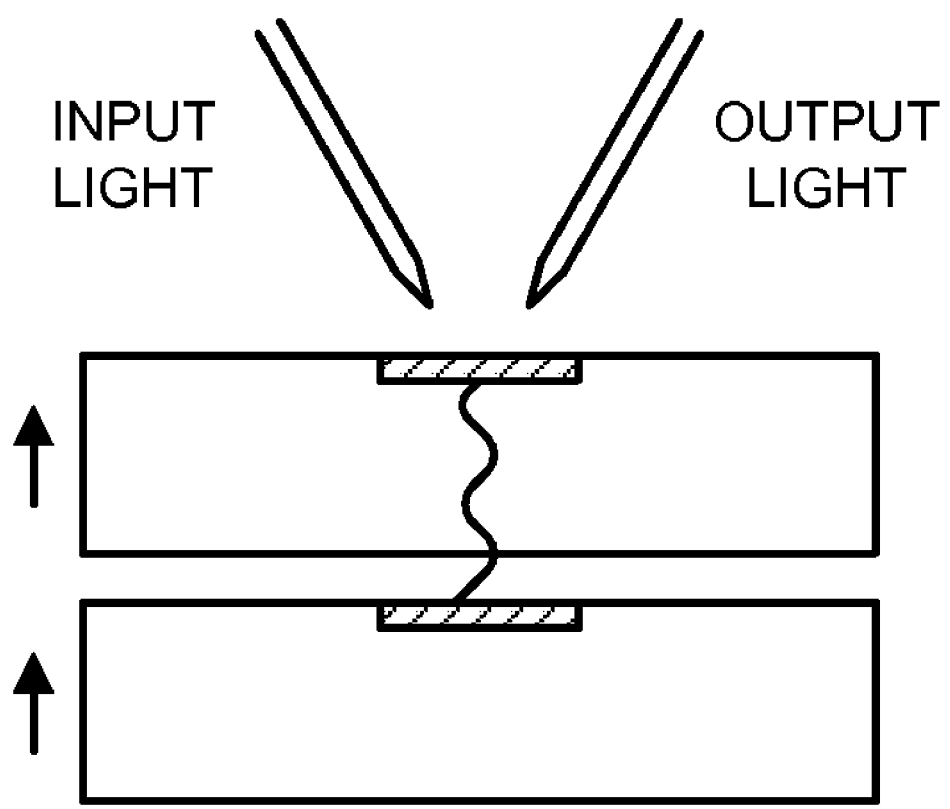
FIG. 10 illustrates a three-terminal optoelectronic device in accordance with an embodiment of the present invention.

FIG. 10 illustrates a three-terminal optoelectronic device in accordance with an embodiment of the present invention. An example of such an optoelectronic device could be an optical modulator with fiber input and output, controlled and modulated by through-chip proximity connections. Likewise, one can extend this concept to optoelectronic devices with optical through-chip connections, controlled and modulated with surface proximity connections. The benefit of two-sided communication from the chip or wafer is that it allows the formation of such devices in dense two-dimensional structures. One may similarly imagine three-dimensional chip stacks with such optoelectronic devices on the end faces of such chip-stacks.

In another embodiment of the present invention, the structures generalize from silicon to other semiconductor or dielectric materials that support logic circuits. Also, the communication structures generalize to electromagnetic waves of any frequency in the electromagnetic spectrum. Thus, without loss of generality, the structures may extend to any electromagnetic communication through a chip or wafer, combined with any electromagnetic communication from the surface of the chip or wafer.

Spatial Balancing of Data Across an Array of Electromagnetic Vias

Certain patterns of un-encoded data communicated through electromagnetic vias can cause a supply on the other chip to bounce. For instance, consider the case that n Electromagnetic coupled signals all transfer from low to high. Because the "return" path for the coupled charge (for capacitive coupling) or induced current (for inductive coupling) may be over a large distance, the inductance of that path will be quite high (typically including packaging bondwires and traces, printed circuit board wires, and off-board wiring), and the supplies on the two chips will bounce for roughly the time constant of the return path. The supply noise bounce could cancel virtually all of the signal, and hence no net signal will be received.

Instead consider that each signal is encoded differentially on two electromagnetic vias. In this example, there is no net coupled charge, and hence, no cross-talk noise. The quality of the conductive return path connecting the chip's supplies is no longer critical because no net charge or current is coupled.

In addition to differential coupling, other forms of encoding are possible that cause the net difference of high versus low transitions to be reduced. For instance, spatially coding with codes such as 8b10b, 4b6b reduce this net difference for a lower overhead cost of numbers of pins than differential signaling (which would be called 1b2b in this nomenclature).

Temporal-Balancing of Data Through Each Electromagnetic Via

An unbalanced data signal can suffer inter-symbol-interference if electromagnetic vias have lateral conductivity to other electromagnetic vias. Otherwise, the coupling of a stream of non-transitioning data (e.g. a string of "1"s) would drain away through this conductivity. In contrast, a balanced-data signal may tolerate electromagnetic vias that have some amount of lateral conductivity, so long as the low-frequency pole due to this conductivity is below the lowest frequency present in the AC signal.

Note that the present invention contrasts with incidental electromagnetic cross-talk. Data balancing, either spatially or temporally, clearly distinguishes the present invention from incidental electromagnetic cross-talk. Also, electronic alignment clearly distinguishes the present invention from incidental electromagnetic cross-talk.

Electronic Alignment

Alleviating the need for lateral alignment, electronic alignment can be used to shift positions of transmit or receive structures to compensate for misalignment between communicating chips. The basic idea is to create a micro-pad array structure that can be electronically steered to create a virtual pad array. By arraying the electromagnetic vias on a finer pitch, as well as matching to or exceeding the micro-pad pitch used for electronic alignment, the electronic alignment can also be performed through electromagnetic vias.

Another use of finer pitch vias structures is that this would remove the need for fine alignment between the vias and the receiving or transmit pad (or loop) structures.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating an integrated circuit chip assembly module comprised of a first integrated circuit chip and a second integrated circuit chip, wherein the integrated circuit chips have an active face upon which active circuitry and signal pads reside, and a back face opposite the active face, the method comprising:

fabricating a substrate of the first integrated circuit chip from a solid block of a single material, wherein the material is a substance through which electromagnetic signals can pass;

fabricating a set of smart pixels in the circuitry in the active face of the first integrated circuit chip, wherein each smart pixel includes a separate circuit for performing a function of the smart pixel; and fabricating the integrated circuit chip assembly module to create an electromagnetic via that facilitates using non-conductive electromagnetic signaling for communication between the signal pads on the first integrated circuit chip and the signal pads on a second integrated circuit chip by coupling the first and second integrated circuit chips so that the substrate of the first integrated circuit chip is configured as the electromagnetic via;

wherein the electromagnetic via couples the signal pads on the active face of the first integrated circuit chip to the back face of the first integrated circuit chip so that the first integrated circuit chip can communicate with the second integrated circuit chip while the back face of the first integrated circuit chip is adjacent to the active face of the second integrated circuit chip.

2. The method of claim 1, wherein the non-conductive electromagnetic signaling comprises capacitive signaling.

3. The method of claim 1, wherein the non-conductive electromagnetic signaling comprises inductive signaling.

4. The method of claim 1, wherein the non-conductive electromagnetic signaling comprises optical signaling.

5. The method of claim 1, further comprising fabricating an array of electromagnetic vias structured to facilitate:

spatial balancing of electromagnetic signals;

temporal balancing of electromagnetic signals; or electronic alignment of the integrated circuit chip to a second integrated circuit chip.

6. The method of claim 1, further comprising:

fabricating the integrated circuit chip assembly module to create a second electromagnetic via;

wherein the second electromagnetic via can couple the first integrated circuit chip to the second integrated circuit chip or to a third integrated circuit chip; and wherein the second electromagnetic via can facilitate a different type of signaling than the electromagnetic via.

7. The method of claim 1, further comprising doping the substrate of the first integrated circuit chip so that a portion of the substrate is semi-insulating.

8. The method of claim 1, further comprising:

stacking the first integrated circuit chip with other integrated circuit chips in the integrated circuit chip assembly module to create multiple layers of integrated circuit chips; and wherein the multiple layers of integrated circuit chips in the module are interconnected with electromagnetic vias.

9. The method of claim 1, wherein the function performed by the circuit for at least one of the smart pixels comprises one of:

a logic function;

a memory function;

an input/output function, and a control function.

* * * * *